(12) United States Patent
Jones et al.

(10) Patent No.: US 10,094,040 B2
(45) Date of Patent: Oct. 9, 2018

(54) CONTROLLING A TEMPERATURE OF A CRUCIBLE INSIDE AN OVEN

(71) Applicant: EBNER Industrieofenbau GmbH, Leonding (AT)

(72) Inventors: Bernard D. Jones, Leonding (AT); Dean C. Skelton, Fitzwilliam, NH (US); Thomas S. McGee, Stratham, NH (US); Robert Ebner, Leonding (AT)

(73) Assignee: Ebner Industrieofenbau GMBH, Leonding (AT)

( * ) Notice: Subject to any disclaimer, the term of this patent is extended or adjusted under 35 U.S.C. 154(b) by 0 days.

(21) Appl. No.: 15/034,841

(22) PCT Filed: Nov. 3, 2014

(86) PCT No.: PCT/EP2014/073540
§ 371 (c)(1),
(2) Date: May 5, 2016

(87) PCT Pub. No.: WO2015/067552
PCT Pub. Date: May 14, 2015

(65) Prior Publication Data
US 2016/0281259 A1    Sep. 29, 2016

(30) Foreign Application Priority Data
Nov. 7, 2013   (GB) .................................. 1319671.2

(51) Int. Cl.
C30B 11/00    (2006.01)
C30B 29/20    (2006.01)
C30B 35/00    (2006.01)

(52) U.S. Cl.
CPC .......... *C30B 11/002* (2013.01); *C30B 11/003* (2013.01); *C30B 11/006* (2013.01); *C30B 29/20* (2013.01); *C30B 35/00* (2013.01)

(58) Field of Classification Search
CPC combination set(s) only.
See application file for complete search history.

(56) References Cited

U.S. PATENT DOCUMENTS

| 5,063,986 A | 11/1991 | Murakami et al. |
| 5,067,551 A | 11/1991 | Murakami et al. |

(Continued)

FOREIGN PATENT DOCUMENTS

| WO | WO 2011/037343 A2 | 3/2011 | |
| WO | WO/2011/136479 | * 11/2011 | ............. H01L 31/18 |

(Continued)

OTHER PUBLICATIONS

International Preliminary Report on Patentability and Written Opinion of the ISA dated May 19, 2016 for International Application No. PCT/EP2014/073540, 10 pages.

(Continued)

*Primary Examiner* — Erin F Bergner
(74) *Attorney, Agent, or Firm* — Lewis Roca Rothgerber Christie LLP

(57) ABSTRACT

Embodiments of the present invention relate to a furnace system for growing crystals. The furnace system comprises a crucible for growing a crystal and a furnace comprising a housing having an inner volume. The housing comprises a through hole connecting the inner volume with an environment of the housing. An insulation plug is movably insertable into the through hole for controlling a heat extraction out of the crucible by radiation, wherein the insulation plug is free of a force transmitting contact with the crucible.

17 Claims, 5 Drawing Sheets

(56) References Cited

U.S. PATENT DOCUMENTS

Figure 1:
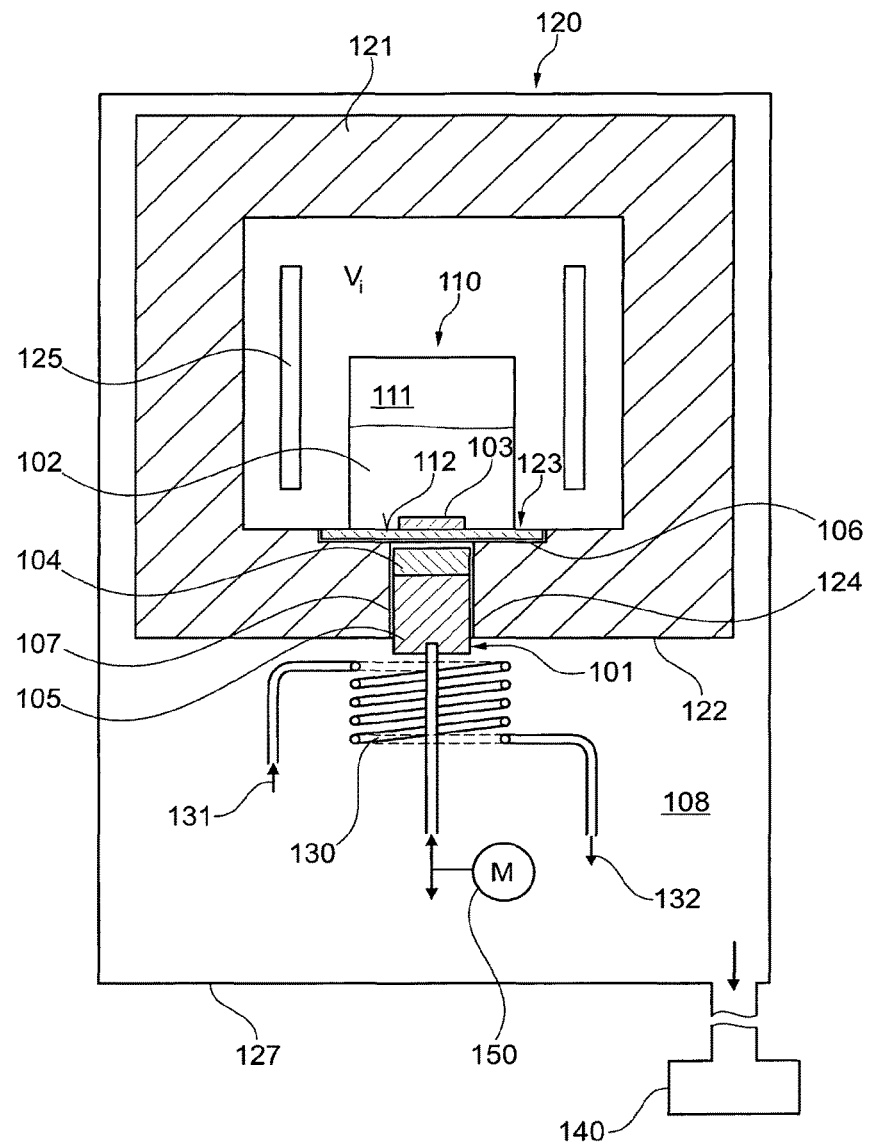

| | | | |
|---|---|---|---|
| 8,062,423 B2 | 11/2011 | Lew | |
| 2007/0044707 A1* | 3/2007 | Schmid | ............ C30B 11/007 117/11 |
| 2007/0227189 A1 | 10/2007 | Sakai | |
| 2009/0090296 A1 | 4/2009 | Gil et al. | |
| 2013/0036769 A1 | 2/2013 | Moon et al. | |
| 2013/0133569 A1 | 5/2013 | Lan et al. | |
| 2013/0152851 A1 | 6/2013 | Li et al. | |
| 2014/0150717 A1 | 6/2014 | Moon et al. | |
| 2014/0261158 A1 | 9/2014 | Wendel et al. | |

FOREIGN PATENT DOCUMENTS

| | | |
|---|---|---|
| WO | WO 2013/019401 A1 | 2/2013 |
| WO | WO 2013/025072 A2 | 2/2013 |
| WO | WO 2013/040219 A1 | 3/2013 |

OTHER PUBLICATIONS

International Search Report of corresponding PCT/EP2014/073540, dated Dec. 15, 2014, 5 pages.
Written Opinion of the International Searching Authority of corresponding PCT/EP2014/073540, dated Dec. 15, 2014, 8 pages.
Office action issued in parallel EP Application No. 14 795 600.7, dated Nov. 6, 2017, 8 pages.
Office Action issued in parallel Russian Application No. 2016121459, dated Mar. 6, 2018, with English Translation, 7 pages.

* cited by examiner

CONTROLLING A TEMPERATURE OF A CRUCIBLE INSIDE AN OVEN

CROSS-REFERENCE TO RELATED APPLICATIONS

This application is a National Phase Patent Application of International Patent Application Number PCT/EP2014/073540, filed on Nov. 3, 2014, which claims priority to and the benefit of the filing date of the British Patent Application No. 1 319 671.2 filed Nov. 7, 2013, the entire disclosures of which are hereby incorporated by reference.

TECHNICAL FIELD

Embodiments of the invention relate to a furnace system for growing crystals and to a method for growing crystals. Specifically, the invention relates to a furnace system comprising controlling a temperature of a crucible inside an oven.

TECHNOLOGICAL BACKGROUND

In conventional furnaces for growing crystals a crucible is placed inside a furnace chamber. In order to form a crystal component, a seed crystal is arranged inside the crucible. The seed crystal is generally made of a desired crystal material which is the material of the crystal component to be formed. The furnace is heated up such that a crystal material inside the crucible is provided in a molten and liquid state.

The crystal component is formed by growing the crystal component starting from the seed crystal at the bottom of the crucible. In order to achieve a crystal growing from the bottom of the crucible, the temperature of the bottom of the crucible has to be controlled exactly, so as not to melt the seed crystal and so that the already grown solid crystal component will not become liquid again due to temperature variations. The bottom of the furnace should therefore be cooler than the top, preferably with a stabilizing temperature gradient that minimizes convection. The material in the crucible can solidify from the bottom to the top due to the vertical temperature gradient.

In conventional furnace systems it is known to use a cooled crucible shaft and/or movable temperature shields in order to cool the bottom section of the crucible and the crystal component which has already been formed. By the cooled shaft or temperature shields, a controlled solidification of the crystal liquid in the crucible from the bottom upwards may be controlled and a desired temperature gradient in the crucible may be provided. Furthermore, it is known to extract heat from the bottom of the furnace.

SUMMARY OF THE INVENTION

There may be a need to provide a furnace which improves a controlled solidification of a crystal liquid for growing crystals.

According to embodiments of the invention, a furnace system for growing crystals and a method for growing crystals according to the independent claims are provided.

According to a first aspect of the present invention, a furnace system for growing crystals is presented. The furnace system comprises a crucible for growing a crystal and a furnace comprising a housing having an inner volume forming a heating zone. The crucible is arranged within the inner volume, wherein the housing comprises a through hole connecting the inner volume with an environment, i.e. an intermediate volume, of the housing. An insulation plug is movably insertable into the through hole for controlling a heat extraction, i.e. by radiation, out of the crucible and out of the inner volume, respectively. The insulation plug is free of a force transmitting contact with the crucible.

According to a further aspect of the present invention a method for growing crystals is presented. According to the method a crucible is provided. The crucible is arranged within the inner volume of a housing of a furnace, wherein the housing comprises a through hole connecting the inner volume with an environment, i.e. an intermediate volume, of the housing. An insulation plug is movably inserted into the through hole for controlling a heat extraction, i.e. by radiation, out of the crucible and out of the inner volume, respectively. The insulation plug is free of a force transmitting contact with the crucible.

The furnace comprises a housing which houses an inner volume. The furnace comprises heating elements, in particular radiation heating elements, which heat the inner volume until a desired temperature is reached. The temperature which may be provided inside the inner volume may be 100° C. to 1000° C., preferably to approximately 2100° C. or more. The housing is made of an insulating material, such that the inner volume is thermally isolated from an environment, i.e. an intermediate volume, surrounding the housing. The furnace may further comprise an outer housing which houses the housing. An intermediate volume is formed between the outer housing and the housing such that further furnace equipment, such as a heat exchanger, may be installed within the intermediate volume. A vacuum atmosphere of the furnace may be generated under operation inside the inner volume and the intermediate volume. Alternatively, an inert gas atmosphere of the furnace may be generated under operation inside the inner volume and the intermediate volume.

The crucible comprises an inner growth volume. Inside the crucible, a seed element may be placed. The seed element is made of a desired single crystal material, such as sapphire. Furthermore, an initial material, such as a desired crystal material, e.g. high purity alumina crackle, is put into the inner growth volume of the crucible. If the temperature inside the crucible increases, the initial material becomes molten. The furnace is adapted for heating the crucible in such a way that a temperature gradient from e.g. the bottom of the housing to the top of the housing is adjustable. In other words, the bottom surface of the crucible may be kept colder than an area of the crucible spaced apart from the bottom surface of the crucible.

This controlled temperature gradient from the bottom of the housing and in particular of the crucible to the top of the crucible is adjusted by forming the through hole into the housing, e.g. into the bottom of the housing, in order to provide a radiative thermal coupling between the inner volume and the intermediate volume of the furnace.

In order to control the heat extraction through the through hole of the housing, an insulation plug is plugged and movably inserted into the through hole. Hence, if the bottom surface of the crucible is too hot, the insulation plug is moved away from the crucible to allow more radiation loss, so that heat may be extracted through the through hole by radiation. If the bottom surface of the crucible is too cold, the insulation plug is moved through the through hole and toward the crucible in order to interrupt the heat extraction through the through hole. Respective temperature sensors may be installed inside the inner volume in order to measure the temperature gradient between the bottom and the top of the crucible and the inner volume, respectively. Hence, the energy transfer between the inner volume and the environment can be well regulated in every mode of operation and can be reduced to the energy loss value of the surrounding housing insulation when the insulation plug is e.g. fully inserted into the through hole.

According to an approach of the present invention, the insulation plug (and e.g. the further insulation plug) is free of a force transmitting contact with the respective crucible. Hence, the insulation plug is not used for supporting the crucible, i.e. the weight force of the crucible is not transferred to the crucible. Furthermore, the (further) insulation plug is not coupled to the housing in a force transmitting manner. Hence, the insulation plug and e.g. the further insulation plug are freely movable within the respective through holes of the housing without supporting the crucible and without being mounted to the housing. Hence, due to the independent movability of the insulation plug within the respective through holes, a controlled and flexible thermal extraction is achieved.

According to an exemplary embodiment of the present invention, the housing comprises a bottom with a supporting area onto which the crucible is supported, wherein the supporting area comprises the through hole connecting the inner volume with the environment (i.e. the intermediate volume) of the housing.

Hence, according to a further exemplary embodiment of the present invention the crucible is arranged within the inner volume such that the through hole is covered by a bottom surface of the crucible.

According to an exemplary embodiment, the bottom surface of the crucible has a first diameter and wherein a top end of the insulation plug has a second diameter which is equal to or smaller than the first diameter.

The top end of the insulation plug is the end of the insulation plug which is closest to the bottom surface of the crucible. If the second diameter of the installation plug is equal to the first diameter of the bottom surface of the crucible, a homogeneous heat extraction and heat control along the complete bottom surface, in particular between the edge and the centre of the bottom surface of the crucible, is achieved.

According to an exemplary embodiment, the crucible comprises a seed crystal which has a cylindrical profile with a crystal diameter. A second diameter of a top end of the insulation plug is equal to the crystal diameter.

The seed crystal is formed for example like a short cylindrical bar. The seed crystal extends for example along the bottom surface of the crucible. In particular, the crystal diameter may be more than 80%, in particular 90% to 100%, of the first diameter of the bottom surface of the crucible.

If the second diameter of the insulation plug is additionally adapted to the first diameter of the bottom surface of the crucible and the crystal diameter, an effective and high quality crystal growth inside the crucible is provided.

In particular, the crystal diameter of the seed crystal may be increased which will reduce the time until a crystal growth can begin and additionally will avoid crystalline quality defects that may be produced by the interaction of the seed crystal and the bottom of the crucible. The diameter of the movable insulation plug matches for example to a larger seed diameter of the seed crystal without affecting the ability to close off and control the amount of heat extracted from the bottom of the crucible during different stages of the process.

Hence, a full diameter seed crystal is provided and the gaps between sidewalls of the crucible and the edges of the seed crystal are reduced. Furthermore, if the second diameter of the installation plug is adjusted to the first diameter and/or the crystal diameter, a homogeneous heat control along the bottom of the crucible and along the whole crystal length is achieved. This has the advantage of initiating growth faster and avoids the formation of defects due to the interaction of the bottom of the crucible and the molten alumina/growing sapphire crystal inside the crucible. For example, with a smaller diameter seed, it is necessary to try to grow the crystal first radially outward from the edge of the seed crystal and then initiate vertical growth. Starting with a larger/full diameter seed crystal according to the exemplary embodiment avoids this.

According to an exemplary embodiment, a third diameter of the through hole is adjustable to the second diameter to the second diameter of the top end of the insulation plug. The third diameter of the through hole is adapted in particular to the second diameter of the installation plug such that gaps between the through hole and the installation plug are reduced in order to provide an exact and accurate temperature control.

The through hole is formed in the supporting area of the bottom of the housing, wherein the crucible rests with its bottom surface onto the supporting area. Hence, on the one side, the bottom of the housing supports the crucible and, on the other side, heat from the bottom surface of the crucible may directly be extracted through the through hole to the environment, i.e. the intermediate volume.

The supporting area may be formed by a protrusion or a recess of the bottom of the housing. If the supporting area is formed by a recess, the crucible may be fixed and/or aligned (orientated) within the recess of the bottom. A below described supporting plate may be arranged within the recess of the bottom.

Because the bottom surface of the crucible rests onto the bottom of the housing and thereby covers the through hole, the inner volume is separated from the environment (i.e. the intermediate volume) by the crucible itself. Even if the bottom surface of the crucible has to be cooled, only the insulation plug is removed but the bottom surface of the crucible still covers the through hole. The heat is extracted from the bottom surface of the crucible through the through hole by radiation (i.e. radiation cooling).

Thermal radiation describes the transfer of energy to or from a body (e.g. the bottom surface of the crucible) by means of the emission or absorption of electromagnetic radiation.

According to an exemplary embodiment of the present invention, the insulation plug comprises a heat radiation section which forms a free end of the insulation plug facing a surface, in particular a bottom surface, of the crucible.

According to a further exemplary embodiment of the present invention, the heat radiation section comprises a material which has a heat transfer coefficient of more than (approximately) 50 W/(m*K), in particular more than (approximately) 90 W/(m*K).

The heat radiation section may be formed for example of a carbon or graphite material in order to provide proper heat transfer characteristics. Hence, heat which is radiated from the bottom surface of the crucible may be absorbed by the heat radiation section of the insulation plug. Hence, the heat may be extracted by the heat radiation section very efficiently.

According to a further exemplary embodiment of the present invention, the insulation plug comprises an insulation section which forms a free end of the insulation plug facing the environment, i.e. the intermediate volume, of the housing.

According to a further exemplary embodiment of the present invention, the insulation section comprises a material which has a heat transfer coefficient of less than 20 W/(m*K), in particular less than 1 W/(m*K).

The insulation section may be formed for example of an insulating material, such as a graphite material.

According to a further exemplary embodiment of the present invention, an area of the bottom surface of the crucible has the same size or is larger than an opening cross section of the through hole. Hence, by the exemplary embodiment, it is ensured that the bottom surface of the crucible completely covers the opening of the through hole.

According to a further exemplary embodiment of the present invention, the furnace system further comprises a supporting plate which is arranged between the bottom surface of the crucible and the supporting area.

The supporting plate may be an integral part of the bottom surface of the crucible or a separate part. The supporting plate may be made of a material with a high thermal conductivity which has a heat transfer coefficient of more than e.g. (approximately) 50 W/(m*K), in particular more than (approximately) 90 W/(m*K).

Hence, the area of the bottom of the housing which surrounds the supporting area and/or the supporting area itself may be made of an insulating material which comprise a low heat transfer coefficient, e.g. of less than 10 W/(m*K). Hence, a good isolation between the inner volume and the environment is given so that also a good control of heat transfer is achieved. However, the supporting plate covers the opening of the through hole and provides a good heat radiation characteristic, so that heat may be extracted through the through hole although the housing is made of a highly thermal insulating material.

According to a further exemplary embodiment of the present invention, the insulation plug is movably supported such that the insulation plug is movable in a direction towards the crucible and away from the crucible.

For example, the insulation plug is coupled to a motor, such as a hydraulic or electric motor, which drives the insulation plug inside the through hole and relative to the bottom surface of the crucible.

The insulation plug may be moved within the through hole stepwise or continuously. In this case, between the insulation plug and the bottom surface a volume section is provided, such that the heat is extracted from the bottom surface of the crucible via the volume section to the insulation plug by radiation.

Specifically, if the insulation plug comprises the heat radiation section, the insulation plug may be pulled out from the through hole in such a way that a part of the heat radiation section is pulled out of the through hole and a further part of the heat radiation section is still located inside the through hole. Hence, the heat from the bottom surface of the crucible is extracted via the volume section inside the through hole to the heat radiation section. Further, the part of the heat radiation section which is pulled out of the through hole gives the heat further to the environment and the intermediate volume, respectively.

Hence, by moving the insulation plug inside the through hole in a direction towards and away from the bottom surface of the crucible, the heat extraction from the bottom surface of the crucible is exactly controllable. Hence, a proper control of the crystal growth inside the crucible is achieved.

According to a further exemplary embodiment of the present invention, the furnace system further comprises a heat exchanger which is thermally coupled to the insulation plug for transferring heat between the insulation plug and the heat exchanger. The term "thermally coupled" describes an arrangement of the heat exchanger with respect to the respective insulation plug such that heat is transferrable (by radiation) from the respective insulation plug to the heat exchanger.

The heat exchanger is arranged within the environment, i.e. the intermediate volume, in particular below the bottom of the housing. The heat exchanger may be a tube-type heat exchanger. The heat exchanger comprises an input for cooling fluid and an output where the fluid which absorbed heat from the insulation plug is bled off.

The tubes of the heat exchanger may partially surround the insulation plug inside the intermediate volume, in particular if the insulation plug is fully or partially moved out of the through hole. In a further exemplary embodiment, the heat exchanger comprises a thermal conducting (metal) cylinder, in particular a copper cylinder, which is arranged inside the intermediate volume and which is coupled to the bottom of the furnace.

The metal cylinder is arranged such that the insulation plug is fully or partially movable out of the through hole and into the cylinder. Tubes of the heat exchanger may be arranged onto an inner or outer surface of the cylinder. The tubes may be brazed or soldered to the inner or outer surface of the cylinder, for example. By the use of the cylinder, a continuous radiation/absorption surface is provided.

The tube type heat exchanger may comprise tubes which extend along a spiral or helical manner and which surrounds the insulation plug. If the insulation plug is movable inside the through hole, the insulation plug may also be movable inside the heat exchanger and out of the heat exchanger in order to control the amount of heat extraction.

Hence, by the above described heat exchanger, a very accurate control of the heat extraction from the insulation plug is achieved and hence a very accurate heat control of the bottom surface of the crucible is achieved.

According to a further exemplary embodiment of the present invention, the furnace system comprises at least one further crucible for growing a further crystal, wherein the further crucible is arranged within the inner volume.

According to a further exemplary embodiment, the housing comprises at least one further through hole connecting the inner volume with the environment, i.e. an intermediate volume. A further insulation plug is movably inserted into the further through hole for controlling the heat extraction out of the inner volume and the crucible, respectively. The further insulation plug is free of any force transmitting contact with the crucible.

According to a further exemplary embodiment, the further crucible is arranged within the inner volume such that the further through hole is covered by a further bottom surface of the further crucible for sealing the inner volume from the environment, i.e. the intermediate volume.

In order to control the heat extraction through the respective through holes inside a wall section, e.g. the bottom of the housing, a respective insulation plug is plugged into a respective through hole in a movable manner. Hence, if the bottom surface of one of the crucibles is too hot, the respective insulation plug is moved, so that heat may be extracted through the respective through hole by radiation. If the bottom surface of the respective crucible is too cold, the insulation plug is moved inside the respective through hole towards the respective crucible in order to reduce the heat extraction through the respective through hole. Respective temperature sensors may be installed inside the inner volume in order to measure the temperature gradient between the bottom and the top of the housing and the inner volume, respectively.

With the present exemplary embodiment, a furnace is provided which houses within its housing a plurality of crucibles. In each of the respective crucibles a crystal component may be formed by crystal growth. Because below each crucible a respective through hole in the bottom of the housing is formed, a desired heat extraction through each of the through holes is achieved, such that each of the plurality of crucibles may be provided with a desired temperature gradient from the bottom surface of a respective crucible to a top of the crucible. Hence, within one heating procedure, two or a plurality of crystal components may be formed at the same time. Hence, a more efficient production of crystal components is achieved by the above described furnace system.

The furnace system according to the exemplary embodiment may comprise beside the through hole and the further through hole a further plurality of through holes within the bottom of the housing. Accordingly, in each of the plurality of through holes, a respective installation plug is insertable. Accordingly, above each of the respective through holes, respective crucibles, and hence a plurality of crucibles, may be arranged inside the inner volume of the furnace, so that a plurality of crystal components may be formed within the furnace according to the present invention.

According to a further exemplary embodiment, the furnace comprises a radiant heater device for heating the crucible and/or the further crucible, wherein the radiant heater device is arranged inside the inner volume of the housing.

The radiant heater device comprises specifically a heat radiating wall such that radiation heating of the crucibles is achieved. Specifically, the radiant heater device comprises a cylindrical profile, wherein the heater element surrounds the crucibles. Hence, a constant heat radiation around the circumference of the crucible is achievable.

The radiant heater device may be driven and heated by an electrical heating.

According to a further exemplary embodiment, the radiant heater device comprises the radiation wall which surrounds both the crucible and the further crucible.

According to a further exemplary embodiment, the radiant heater device comprises a first radiation wall segment and a second radiation wall segment, wherein the first radiant heater wall segment surrounds the crucible and wherein the second radiant heater wall segment surrounds the further crucible.

By the above described exemplary embodiments, each crucible is surrounded by a respective radiation wall. Hence, it is ensured, that around each crucible a respective radiation wall is arranged. In a further exemplary embodiment, each radiation wall may be controlled separately from each other, such that different temperature gradients between the respective crucibles may be controlled. In order to control each radiant heater wall independently from each other, the heater device may be connected to a control unit for controlling the respective temperature gradients inside the inner volume within each crucible.

According to a further exemplary embodiment, at least the through hole (and/or the further through hole) is formed within a respective supporting area of the bottom, wherein the crucible is supported onto the supporting area and/or the further crucible is supported onto a further supporting area, which is spaced apart from the supporting area. The through hole is covered by the bottom surface of the crucible such that the crucible separates the inner volume from the environment, i.e. the intermediate volume. Accordingly, the further through hole may be covered by a further bottom surface of the further crucible such that the further crucible separates the inner volume from the environment, i.e. the intermediate volume.

The respective supporting area may be formed by a protrusion or a recess of the bottom of the housing. If the respective supporting area is formed by a recess, the crucible or the further crucible may be fixed and/or aligned (orientated) within the recess of the bottom. A below described respective supporting plate may be arranged within the respective recess of the bottom.

Because the respective bottom surface of the respective crucible rests onto the bottom of the housing and thereby covers the respective through hole, a separation between the inner volume and the environment, i.e. the intermediate volume, is provided by the respective crucible itself. Even if the respective bottom surface of the crucible has to be cooled, only the respective insulation plug is moved towards or away from the crucible and the respective bottom surface of the respective crucible still covers the respective through hole. The heat is extracted from the respective bottom surface of the respective crucible through the respective through hole by radiation (i.e. radiation cooling).

According to a further exemplary embodiment, the furnace comprises a crucible supporting structure such, as a supporting frame, which is arranged inside the inner volume. The crucible supporting structure comprises a recess into which at least one of the crucibles is arrangable and a further recess into which the further crucible is arrangable.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless otherwise notified, in addition to any combination of features belonging to one type of subject matter also any combination between features relating to different subject matters, in particular between features of the apparatus type claims and features of the method type claims is considered as to be disclosed with this application.

DETAILED DESCRIPTION OF EXEMPLARY EMBODIMENTS

The invention will be described in more detail hereinafter with reference to examples of embodiments but to which the invention is not limited.

Figure 2:
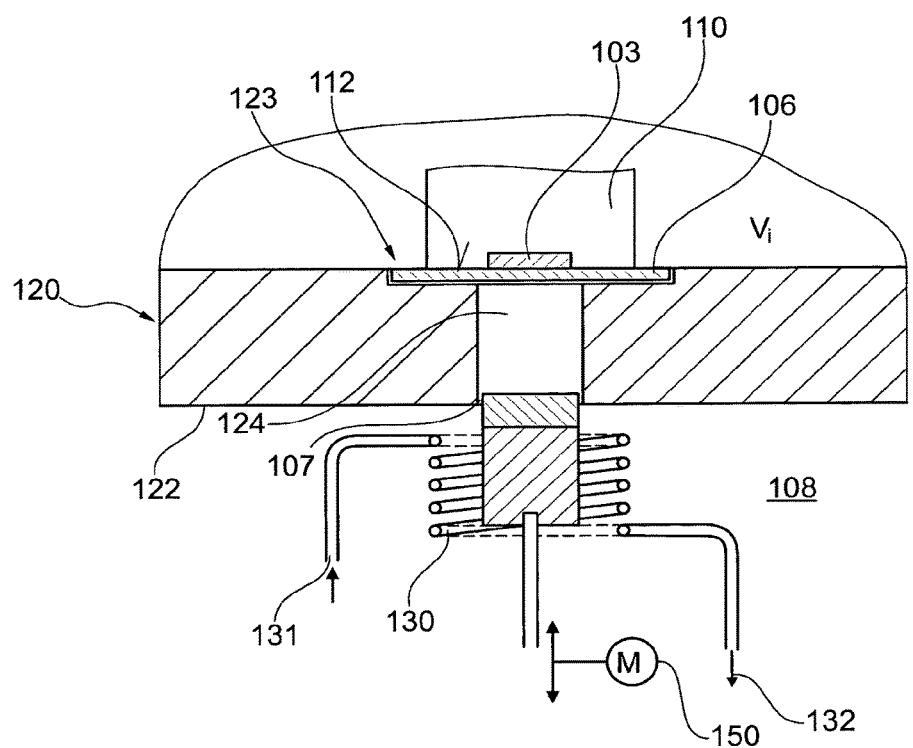
Figure 3:
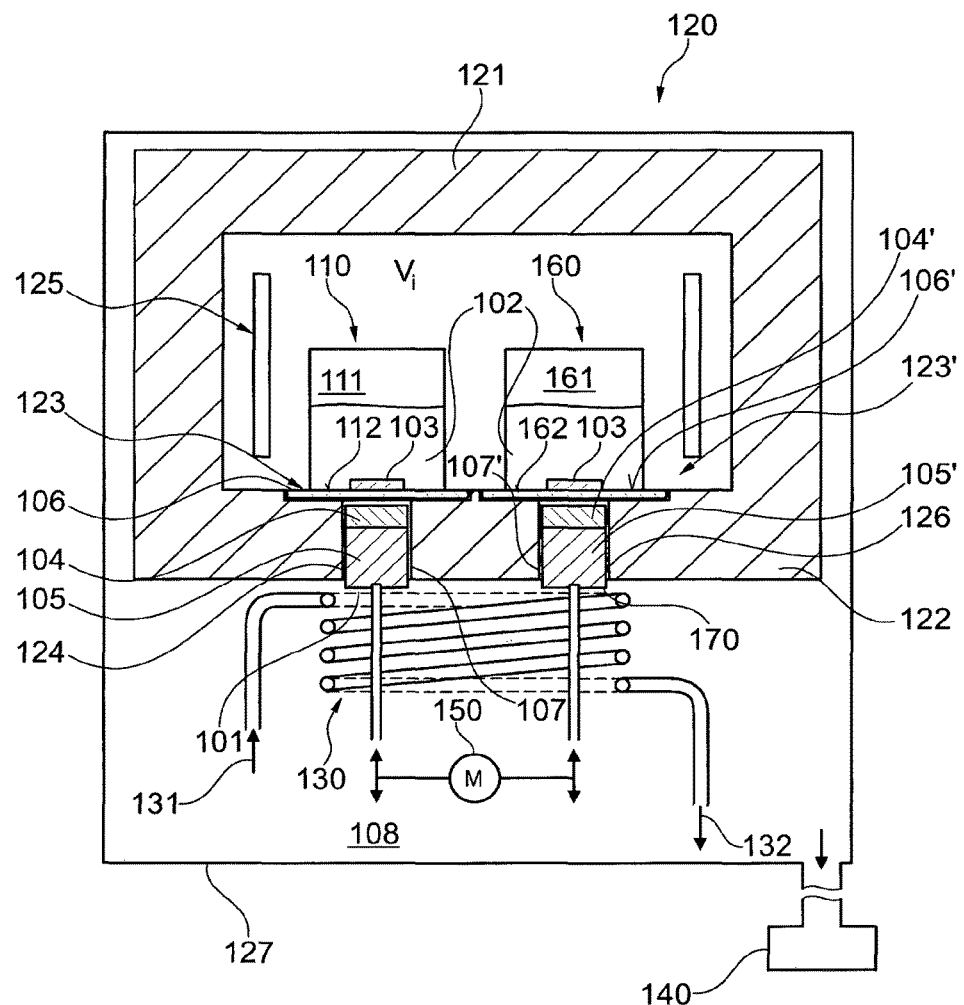
Figure 4:
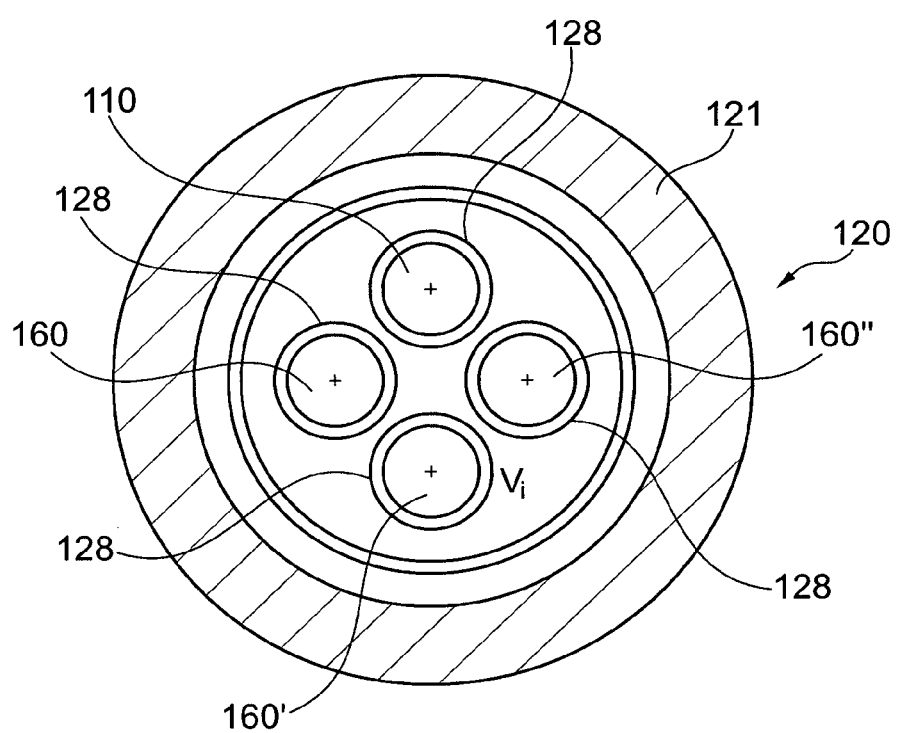
Figure 5:
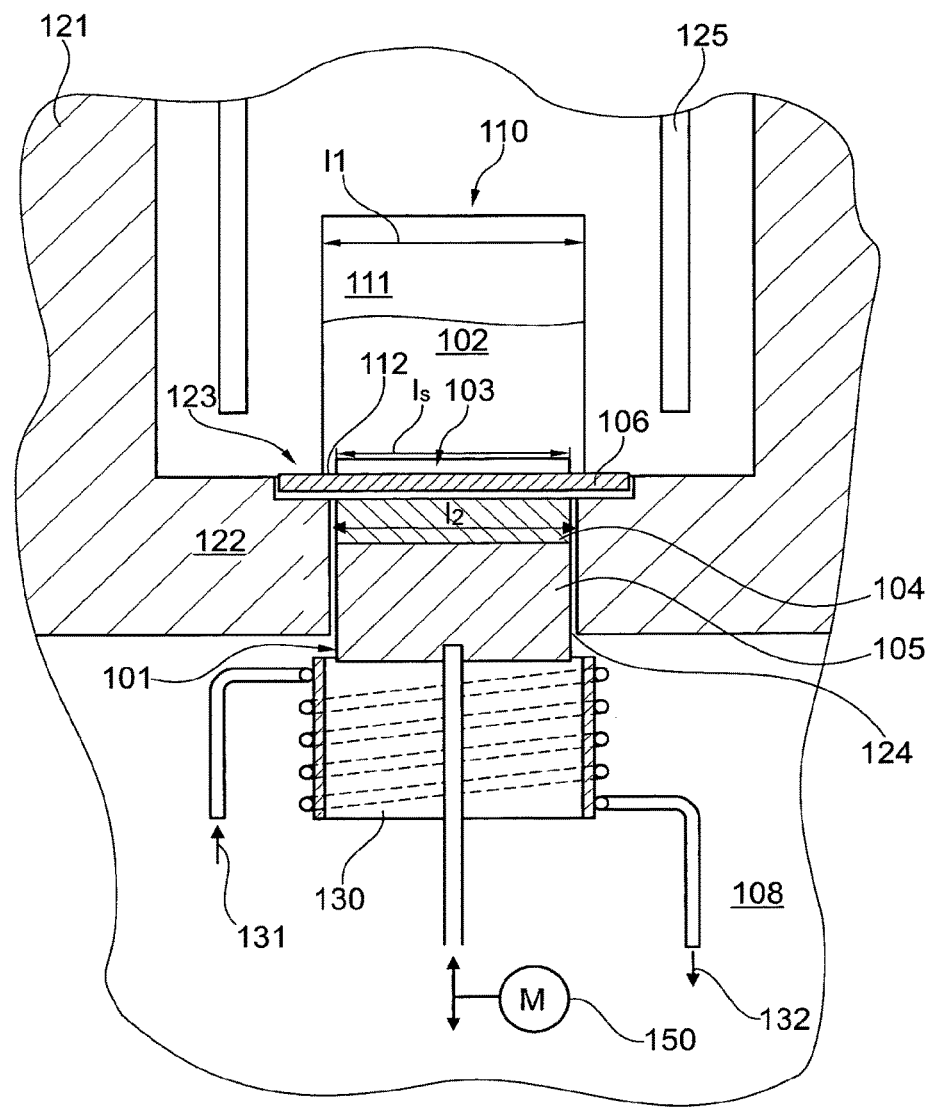

FIG. 1 shows a schematic view of a furnace system according to an exemplary embodiment of the present invention, wherein an insulation plug is fully raised inside a through hole, FIG. 2 shows a schematic view of a furnace system according to an exemplary embodiment of the invention, wherein the insulation plug is fully lowered inside the through hole, FIG. 3 shows a schematic view of a furnace system according to an exemplary embodiment of the present invention, wherein a furnace for heating at least two crucibles is shown, FIG. 4 shows a schematic top view of a furnace system according to an exemplary embodiment of the present invention, wherein a furnace for heating four crucibles with radiation walls is shown, and FIG. 5 shows a schematic view of a furnace system according to an exemplary embodiment of the present invention, wherein the sizes of an insulation plug and a seed crystal are increased.

The illustrations in the drawings are schematic. In different drawings similar or identical elements are provided with the same reference signs.

FIG. 1 shows a furnace system for growing crystals according to an exemplary embodiment of the present invention. The furnace system comprises a crucible 110 which comprises a growth volume 111 for growing a crystal and a furnace 120 comprising a housing 121 having an inner volume Vi forming a heating zone. The crucible 110 is arranged within the inner volume Vi, wherein the housing 121 comprises a through hole 124 connecting the inner volume Vi with an environment of the housing, in particular an intermediate volume 108 between the housing and an outer housing 127. An insulation plug 101 is movably insertable into the through hole 124 for controlling a heat extraction out of the crucible 110, wherein the insulation plug 101 is free of a force transmitting contact with the crucible 110.

The furnace 120 comprises heating elements, in particular a radiant heating device 125, which heat the inner volume Vi until a desired temperature (e.g. within a range of 100° C. to 2100° C.) is reached. The housing 121 is made of an insulating material, such that the inner volume Vi is thermally isolated from the intermediate volume 108 surrounding the housing 121. The furnace 120 further comprises e.g. the outer housing 127 which houses the housing 121. The intermediate volume 108 is formed between the outer housing 127 and the housing 121 such that further furnace equipment, such as a heat exchanger 130, may be installed within the intermediate volume 108. A vacuum atmosphere is generated under operation of the furnace inside the inner volume Vi and the intermediate volume 108. The vacuum atmosphere is generated e.g. by a vacuum pump 140.

The housing 121 comprises a bottom 122 with a supporting area 123 onto which the crucible 110 is supported, wherein the supporting area 123 comprises the through hole 124 connecting the inner volume Vi with the intermediate volume 108. The crucible 110 is arranged within the inner volume Vi such that the through hole 124 is covered by a bottom surface 112 of the crucible 110 for sealing and separating the inner volume Vi from the intermediate volume 108.

The radiant heater device 125 comprises specifically a heat radiating wall such that radiation heating of the crucible 110 is achieved. Specifically, the radiant heater device 125 comprises a cylindrical profile, wherein the heater element 125 surrounds the supporting area 123 and hence the crucible 110. Hence, a constant heat radiation around the circumference of the crucible 110 is achievable.

The crucible 110 comprises the growth volume 111. Inside the crucible 110, a seed element 103 may be placed. The seed element 103 is made of a desired crystal material, such as sapphire. An initial material 102, such as a desired crystal material, e.g. high purity alumina crackle, is put into the growth volume 111. If the temperature inside the crucible 110 increases, the initial material becomes molten. The furnace 120 is adapted for heating the crucible 110, in such a way that a temperature gradient from a bottom surface 112 of the crucible 110 to the top of the crucible is adjustable. In other words, the bottom surface 112 of the crucible 110 may be kept colder than an area of the crucible 110 spaced apart from the bottom surface 112 of the crucible 110.

This controlled temperature gradient within the crucible 110, e.g. the temperature gradient from the bottom surface 112 of the crucible 110 to the top of the crucible 110, is adjusted by forming the through hole 124 into a wall of the housing 121, e.g. the bottom 122 of the housing 121, in order to provide a thermal coupling between the inner volume Vi and the intermediate volume 108. The through hole 124 is formed in the supporting area 123 of the bottom 122 of the housing 121, wherein the crucible 110 rests with its bottom surface 112 onto the supporting area 123. Hence, on the one side the bottom 122 of the housing 121 supports the crucible 110 and on the other side, heat from the bottom surface 112 of the crucible 110 may directly be extracted through the through hole 124 to intermediate volume 108.

The heat extraction and the temperature gradient within the crucible 110 is controlled by the insulation plug 101 which is movably inserted into the through hole 124.

Hence, if the bottom surface 112 of the crucible 110 is too hot, the insulation plug 101 is moved away from the crucible 110 (see e.g. FIG. 2), so that more heat may be extracted through the through hole 124. If the bottom surface 112 of the crucible 110 is too cold, the insulation plug 101 is moved towards the through hole 124 in order to reduce the heat extraction through the through hole 124 (see FIG. 1).

Because the bottom surface 112 of the crucible 110 rests onto the bottom 122 of the housing 121 and thereby covers the through hole 124, a separation between the inner volume Vi and the intermediate volume 108 is provided by the crucible 110 itself.

In order to provide an accurate heat extraction, the insulation plug 101 comprises a heat radiation section 104 which forms a free end of the insulation plug 101 facing the bottom surface 112 of the crucible 110. Additionally, the insulation plug 101 further comprises an insulation section 105 which forms a free end of the insulation plug 101 facing the intermediate volume 108 of the housing 121. The heat radiation section 104 comprises a material which has a higher heat transfer coefficient than a material of the insulation section 105.

As shown in FIG. 1, a supporting plate 106 is arranged between the bottom surface 112 of the crucible 110 and the supporting area 123. The supporting plate 106 may be an integral part of the bottom surface 112 of the crucible 110 or a separate part. The supporting plate 106 may be made of a material with a high thermal conductivity.

Furthermore, as shown in FIG. 1, the insulation plug 101 is movably supported and driven by a (electrical) motor 150, such that the insulation plug 101 is movable in a direction to the crucible 110 and away from the crucible 110. Between the through hole 124 and the insulation plug 101 a gap 107 could be provided.

Furthermore, a heat exchanger 130 is shown, which is thermally coupled to the insulation plug 101 for transferring heat between the insulation plug 101 and the heat exchanger 130. The heat exchanger 130 is arranged within the intermediate volume 108, in particular below the bottom 122 of the housing 121. The heat exchanger 130 comprises an input 131 for a cooling fluid and an output 132 where the fluid which absorbs heat from the insulation plug 101 is bled off. The tubes of the heat exchanger 130 extend along a helical manner and which surrounds the insulation plug 101. The insulation plug 101 is movable inside the heat exchanger 130 and out of the heat exchanger 130 in order to control the amount of heat extraction.

FIG. 2 shows the furnace system shown in FIG. 1, wherein the insulation plug 101 is partially pulled out of the through hole 124. Specifically, the insulation plug 101 comprises the heat radiation section 104. The insulation plug 101 is pulled out from the through hole 124 in such a way that a part of the heat radiation section 104 is pulled out of the through hole 124 and a further part of the heat radiation section 104 is still located inside the through hole 124. Hence, the heat from the bottom surface 112 of the crucible 110 is extracted via radiation to the heat radiation section 104 and then further via re-radiation to the heat exchanger. Further, the part of the heat radiation section 104 which is pulled out of the through hole 124 gives the heat further to the intermediate volume 108 and the heat exchanger 130, respectively.

FIG. 3 shows a furnace system for growing crystals according to an exemplary embodiment of the present invention. The furnace system comprises the crucible 110 with the growth volume 111 for growing a crystal and at least one further crucible 160 with a further growth volume 161 for growing a further crystal.

The furnace 120 comprises the housing 121 having the inner volume Vi, wherein the housing 121 comprises the bottom 122 comprising the through hole 124 connecting the inner volume Vi with the intermediate volume 108 and at least one further through hole 126 connecting the inner volume Vi with the intermediate volume 108. The crucible 110 is arranged inside the inner volume Vi onto the through hole 124 as described in FIG. 1. The further crucible 160 is arranged inside the inner volume Vi above the further through hole 126.

The insulation plug 101 is inserted into the through hole 124 in a movable exchangeable manner for controlling a temperature of the crucible 110 and a further insulation plug 170 which is inserted into the further through hole 126 in a movable manner for controlling a temperature of the further crucible 160.

The furnace 120 comprises heating elements, in particular a radiant heating device 125, which heats the inner volume Vi until a desired temperature (e.g. within a range of 100° C. to 2100° C.) is reached. The housing 121 is made of an insulating material, such that the inner volume Vi is thermally isolated from the intermediate volume 108 surrounding the housing 121.

The radiant heater element 125 comprises specifically a heat radiating wall such that radiation heating of the crucible 110 is achieved. Specifically, the radiant heater element 125 comprises a cylindrical profile, wherein the heater element 125 surrounds the supporting areas 123, 123' and hence the crucibles 110, 160. Hence, a constant heat radiation around the circumference of the crucibles 110, 160 is achievable.

The crucible 110 comprises a growth volume 111. Inside the growth volume 111, a seed element 103 may be placed. The seed element 103 is made of a desired single crystal material, such as sapphire. Furthermore, an initial material, such as a desired crystal material, e.g. high purity alumina crackle, is put into the inner growth volume 111 of the crucible 110. If the temperature inside the crucible 110 increases, the initial material becomes molten. Accordingly, the further crucible 160 comprises a further growth volume 161. Inside the further growth volume 161, a further seed element 103 may be placed. The further seed element 103 is made of a desired single crystal material, such as sapphire. Furthermore, a further initial material 102, such as a desired crystal material, is arranged into the further growth volume 161.

The furnace 120 is adapted for heating the crucibles 110, 160, in such a way that a temperature gradient is produced within the crucible 110, e.g. the temperature gradient from the bottom surface 112 of the crucible 110 to the top of the crucible 110 is adjustable. In other words, the bottom surfaces 112, 162 of the crucibles 110, 160 are kept colder than an area of the crucibles 110, 160 spaced apart from the bottom surfaces 112, 162 of the crucibles 110, 160.

The through hole 124 is formed in the supporting area 123 of the bottom 122 of the housing 121, wherein the crucible 110 is arranged above the through hole 124. Specifically, the crucible 110 may rest with its bottom surface 112 onto a supporting area 123. Hence, on the one side the bottom 122 of the housing 121 supports the crucible 110 and on the other side, heat from the bottom surface 112 of the crucible 110 may directly be extracted through the through hole 124 to the intermediate volume 108. Accordingly, the further through hole 126 is formed in a further supporting area 123' of the bottom 122 of the housing 121, wherein the further crucible 160 is arranged above the further through hole 126. Specifically, the further crucible 160 may rest with its further bottom surface 162 onto the further supporting area 123'.

Because the respective bottom surface 112, 162 of the respective crucible 110, 160 rests onto the bottom 122 of the housing 120 and thereby covers the respective through hole 124, 126, a separation between the inner volume Vi and the intermediate volume 108 is provided by the respective crucible 110, 160 itself. If the bottom surface 112, 162 of a respective crucible 110, 160 has to be cooled, only the respective insulation plug 101, 170 is moved away from the bottom surface 112, 162 of the crucible 110,160. A respective area of a respective bottom surface 112, 162 of a respective crucible 110, 160 may be formed larger than an opening cross section of a respective through hole 124, 126.

As shown in FIG. 3, a respective supporting plate 106, 106' is arranged between the respective bottom surface 112, 162 of the respective crucible 110, 160 and the respective supporting area 123, 123'. The supporting plate 106, 106' may be an integral part of a respective bottom surface 112, 162 of the respective crucible 110, 160 or a separate part. The supporting plate 106, 106' may be made of a material with a high thermal conductivity.

The heat extraction and the temperature gradient within the crucible 110, e.g. the temperature gradient from the bottom surface 112 of the crucible 110 to the top of the crucible 110 is controlled by the insulation plug 101 which is movably inserted into the through hole 124. Accordingly, the further insulation plug 170 which is movably inserted into the further through hole 126 controls the heat extraction through the further through hole 126.

For example, if the bottom surface 112 of the crucible 110 is too hot, the insulation plug 101 is moved away from the bottom surface 112 (see e.g. FIG. 2), so that heat may be extracted through the through hole 124. If the bottom surface 112 of the crucible 110 is too cold, the insulation plug 101 is moved inside the through hole 124 towards the bottom surface 112 in order to interrupt the heat extraction through the through hole 124. Hence, an efficient method of controlling the energy transfer from the crucible bottom to the environment is achieved.

In order to combine the effect of good insulation on the one side and accurate heat extraction on the other side, the respective insulation plug 101, 170 comprises a heat radiation section 104, 104' which forms a free end of the respective insulation plug 101, 170 facing the respective bottom surface 112, 162 of the respective crucible 110, 160. Additionally, the respective insulation plug 101, 170 further comprises a respective insulation section 105, 105' which forms a free end of the respective insulation plug 101, 170 facing the intermediate volume 108.

The respective heat radiation section 104, 104' comprises a material which has a higher heat transfer coefficient than a material of the respective insulation section 105, 105'.

Furthermore, as shown in FIG. 3, the respective insulation plugs 101, 170 are movably supported and driven by a (electrical) motor 150, such that the respective insulation plugs 101, 170 are movable in a direction towards and away from the respective crucible 110, 160.

Specifically, if the respective insulation plug 101, 170 comprises the above described heat radiation section 104, 104', the respective insulation plug 101, 170 may be pulled out from the through hole 124, 126 in such a way that a part of the heat radiation section 104, 104' is pulled out of the respective through hole 124, 126 and a further part of the heat radiation section 104, 104' is still located inside the respective through hole 124, 126. Hence, the heat from the respective bottom surface 112, 162 of the respective crucible 110, 160 is extracted via radiation to the heat radiation section 104 and then via re-radiation to the heat exchanger.

Hence, by moving the respective insulation plug 101, 170 inside the respective through hole 124, 126 in a direction towards and away from the respective bottom surface 112, 162 of the crucible 110, 160, the heat extraction from the respective bottom surface 112, 162 is exactly controllable.

The position of the insulation plugs 101, 170 within a respective through hole 124, 126 may be controlled together, i.e. all insulation plugs 101, 170 are moved together during one control step. Alternatively, the position of each insulation plug 101, 170 within a respective through hole 124, 126 may be controlled individually from each other. Hence, a plurality of respective (i.e. servo) motors may be coupled to each insulation plug 101, 170. A control unit may control each motor and hence each insulation plug 101, 170 individually from each other. Hence, the temperature gradient of each crucible 110, 160 may be controlled individually, because each respective insulation plug 101, 170 may be removed from the respective through hole 124, 126 individually and hence the heat extraction through the respective through hole 124, 126 is individually controllable as well. Hence, even if a plurality of crucibles 110, 160 is arranged inside the inner volume Vi, each temperature gradient of a respective crucible 110, 160 is individually adjustable. In order to improve the control of the respective temperature gradients, to each crucible 110, 160 a respective temperature sensor may be coupled.

A heat exchanger 130 is thermally coupled to the insulation plug 101 and to the further insulation plug 170 for transferring heat between the insulation plug 101 and the further insulation plug 170 and the heat exchanger 130.

The heat exchanger 130 is arranged within the intermediate volume 108, in particular below the bottom 122 of the housing 121. The heat exchanger 130 may be a tube-type heat exchanger. The heat exchanger 130 comprises an input 131 for cooling fluid and an output 132 where the fluid which absorbed heat from the respective insulation plug 101, 170 is bled off.

The tube type heat exchanger 130 comprises tubes which extend along a spiral or a helical manner and which surrounds all insulation plugs 101, 170. Alternatively, the heat exchanger 130 comprises a plurality of heat exchanger units, wherein each heat exchanger unit surrounds one of the insulation plugs 101, 170 and is hence thermally coupled to a respective one of the insulation plugs 101, 170. The respective insulation plugs 101, 170 are movable inside the heat exchanger 130 and out of the heat exchanger 130 in order to control the amount of heat extraction.

FIG. 4 shows a top view of a furnace 120, wherein four crucibles 110, 160', 160'', 160''' are arranged inside the inner volume Vi. The radiant heater device 125 comprises a radiation wall which surrounds the crucibles 110, 160', 160'', 160''' circumferentially. Additionally or alternatively, the radiant heater device 125 further comprises radiation wall segments 128, wherein each radiation wall segment 128 surrounds one of the crucibles 110, 160', 160'', 160'''. Each radiation wall segment 128 may be controlled separately from each other, such that different temperature gradients between the respective crucibles 110, 160', 160'', 160''' may be controlled. In order to control each radiant heater wall segment 128 independently from each other, the heater device 125 may be connected to a control unit for controlling the respective temperature gradients of each crucible 110, 160', 160'', 160'''.

FIG. 5 shows a schematic view of a furnace system which comprises the same features as the furnace system shown in FIG. 1 and FIG. 2.

Additionally, the seed crystal 103 inside the crucible 110 has a cylindrical profile with a crystal diameter Is. The seed crystal 103 shown in FIG. 5 has a larger diameter than the seed crystal 103 shown in FIG. 1 or FIG. 2. In particular, the seed crystal 103 in FIG. 5 has a crystal diameter Is which has for example more than 80% of the first diameter Ii of the bottom surface 112 of the crucible 110. Hence, a very homogeneous crystal growth along the vertical direction may be achieved by providing a respective large scaled seed crystal 103.

In FIG. 5, the second diameter I2 of a top end of the insulation plug 101 is equal or slightly smaller than the first diameter I1 of the bottom surface 112 of the crucible 110. Specifically, the second diameter I2 of a top end of the insulation plug 101 is equal to the crystal diameter Is. If the second diameter I2 of the installation plug 101 is equal to the first diameter I1 and/or to the crystal diameter Is, a homogeneous heat extraction and heat control along the complete bottom surface 112, in particular between the edge and the centre of the bottom surface 112 of the crucible 110, is achieved.

The seed crystal 103 is formed for example like a short cylindrical bar. The seed crystal 103 lies for example onto the bottom surface 112 of the crucible.

The second diameter of the movable insulation plug 101 matches for example to the larger crystal seed diameter Is of the seed crystal 103 without affecting the ability to close off and control the amount of heat extracted from the bottom of the crucible 110 during different stages of the process.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

LIST OF REFERENCE SIGNS

| | |
|---|---|
| 101 | insulation plug |
| 102 | liquid/molten material |
| 103 | seed crystal |
| 104 | heat radiation section |
| 105 | insulation section |
| 106 | supporting plate |
| 107 | gap |
| 108 | intermediate volume |

| 110 | crucible |
| 111 | growth volume |
| 112 | bottom surface |
| 120 | furnace |
| 121 | housing |
| 122 | bottom |
| 123 | supporting area |
| 124 | through hole |
| 125 | radiant heater device |
| 126 | further through hole |
| 127 | outer housing |
| 128 | radiation wall segment |
| 130 | heat exchanger |
| 131 | input |
| 132 | output |
| 140 | vacuum pump |
| 150 | motor |
| 160 | further crucible |
| 161 | further growth volume |
| 162 | further bottom surface |
| 170 | further insulation plug |
| Vi | inner volume |
| I1 | first diameter |
| I2 | second diameter |
| Is | crystal diameter |

The invention claimed is:

1. A furnace system for growing crystals, the furnace system comprising: a crucible for growing a crystal; a furnace comprising a housing having an inner volume forming a heating zone; wherein the crucible is arranged within the inner volume, wherein the housing comprises a through hole connecting the inner volume with an environment outside of the housing; and an insulation plug which is movably insertable into the through hole for controlling a heat extraction out of the crucible by radiation, wherein the insulation plug is free of a force transmitting contact with the crucible, wherein the insulation plug comprises a heat radiation section which forms a free end of the insulation plug facing a bottom surface of the crucible; and wherein the insulation plug comprises an insulation section which forms a free end of the insulation plug facing the environment outside of the housing.

2. The furnace system according to claim 1, wherein the housing comprises a bottom with a supporting area onto which the crucible is supported, and
wherein the supporting area comprises the through hole connecting the inner volume with the environment of the housing.

3. The furnace system according to claim 1, wherein the crucible is arranged within the inner volume such that the through hole is covered by a bottom surface of the crucible for sealing the inner volume from the environment.

4. The furnace system according to claim 1, wherein a bottom surface of the crucible has a first diameter, and
wherein a top end of the insulation plug has a second diameter which is equal to the first diameter.

5. The furnace system according to claim 1, wherein the crucible comprises a seed crystal which has a cylindrical profile with a crystal diameter,
wherein a second diameter of a top end of the insulation plug is equal to the crystal diameter, and
wherein in particular a third diameter of the through hole is adjustable to the second diameter of the top end of the insulation plug.

6. The furnace system according to claim 1, wherein the heat radiation section comprises a material which has a heat transfer coefficient of more than 50 W/(m*K).

7. The furnace system according to claim 1, wherein the insulation section comprises a material which has a heat transfer coefficient of less than 20 W/(m*K).

8. The furnace system according to claim 2, wherein an area of the bottom surface of the crucible has the same size or is larger than an opening cross-section of the through hole.

9. The furnace system according to claim 2, further comprising a supporting plate which is arranged between the bottom surface of the crucible and the supporting area.

10. The furnace system according to claim 1, wherein the insulation plug is movably supported such that the insulation plug is movable in a direction to the crucible and away from the crucible.

11. The furnace system according to claim 1, further comprising a heat exchanger which is thermally coupled to the insulation plug for transferring heat between the insulation plug and the heat exchanger.

12. The furnace system according to claim 1, further comprising at least one further crucible for growing a further crystal, wherein the further crucible is arranged within the inner volume.

13. The furnace system according to claim 12, wherein the housing comprises at least one further through hole connecting the inner volume with the environment, and
wherein the furnace system further comprises a further insulation plug which is movably insertable into the further through hole for controlling the heat extraction out of the inner volume,
wherein the further insulation plug is free of any force transmitting contact with the crucible.

14. The furnace system according to claim 13, wherein the further crucible is arranged within the inner volume such that the further through hole is covered by a further bottom surface of the further crucible for sealing the inner volume from the environment.

15. The furnace system according to claim 12, wherein the furnace comprises a radiant heater device for heating at least the crucible,
wherein the radiant heater device is arranged inside the inner volume of the housing,
wherein the radiant heater device in particular comprises a radiation wall which surrounds the crucible and the further crucible.

16. The furnace system according to claim 15, wherein the radiant heater device comprises a first radiation wall segment and a second radiation wall segment,
wherein the first radiant heater wall segment surrounds the crucible, and
wherein the second radiant heater wall segment surrounds the further crucible.

17. The furnace system according to claim 12, wherein the furnace comprises a crucible supporting structure which is arranged inside the inner volume, and
wherein the crucible supporting structure comprises a recess into which at least one of the crucibles is arrangeable.

* * * * *